US005556733A

United States Patent [19]

Kusakata et al.

[11] Patent Number: 5,556,733

[45] **Date of Patent: * Sep. 17, 1996**

[54] THERMAL DEVELOPMENT DIAZO COPYING MATERIAL

[75] Inventors: Shigeru Kusakata, Susono; Masanori Rimoto, Mishima, both of Japan

[73] Assignee: Ricoh Company, Ltd., Tokyo, Japan

[ * ] Notice: The term of this patent shall not extend beyond the expiration date of Pat. No. 5,478,689.

[21] Appl. No.: 205,565

[22] Filed: Mar. 4, 1994

[30] Foreign Application Priority Data

| | | | |
|---|---|---|---|
| Mar. 5, 1993 | [JP] | Japan | 5-070905 |
| Sep. 30, 1993 | [JP] | Japan | 5-269863 |

[51] Int. Cl.$^6$ .............................. G03C 1/60; G03C 5/18; G03F 7/021

[52] U.S. Cl. .......................... 430/162; 430/151; 430/157; 430/160; 430/176; 430/177

[58] Field of Search .................................... 430/157, 170, 430/160, 176, 177, 162, 151

[56] References Cited

U.S. PATENT DOCUMENTS

| | | | |
|---|---|---|---|
| 4,659,644 | 4/1987 | Hoshina et al. | 430/182 |
| 5,089,371 | 2/1992 | Nakamura et al. | 430/160 |
| 5,478,689 | 12/1995 | Rimoto et al. | 430/157 |

*Primary Examiner*—John S. Y. Chu
*Attorney, Agent, or Firm*—Oblon, Spivak, McClelland, Maier, & Neustadt, P.C.

[57] ABSTRACT

A thermal development diazo copying material is composed of a support, a diazo layer which contains a diazo compound, and a coupler layer which contains a coupling component, an alkali-soluble resin and a thermofusible material, which are overlaid on the support.

6 Claims, No Drawings

THERMAL DEVELOPMENT DIAZO COPYING MATERIAL

BACKGROUND OF THE INVENTION

1. Field of the Invention

The present invention relates to a thermal development diazo copying material capable of developing latent images formed thereon with the application of heat thereto, which latent images are formed with the thermal development diazo copying material being exposed to light with a transparent or semitransparent image-bearing original being superimposed thereon. The present invention also relates to a thermosensitive recording material on which images can be fixed by the application of light thereto.

2. Discussion of Background

A conventional thermal development diazo copying material is generally composed of a support such as a sheet of paper, or a film, and a photosensitive layer formed thereon, which is mainly composed of a diazo compound, a coupling component, and a coloring auxiliary agent. As such a coloring auxiliary agent, for example, urea and sodium trichloroacetate are employed.

In any diazo copying materials of this kind, latent images are developed by the application of heat to 180° to 200° C. In these copying materials, an alkaline component formed by thermal decomposition of the coloring component contained therein is utilized in the development mechanism.

In an attempt to decrease the development temperature, a thermofusible material such as a higher fatty acid amide is employed as a coloring auxiliary agent. In this development mechanism, the activation of a diazo compound and a coupling component by the thermal fusion thereof is utilized.

Conventional thermal development diazo copying materials, however, have the shortcoming that the precoupling of a diazo compound and a coupling component gradually proceeds during the preservation thereof so that the copying materials become colored.

In order to eliminate this shortcoming, it has been proposed that one of a diazo compound, a coupling component or an alkaline generating agent is contained in the form of discontinuous particles to prevent the mutual contact of the above components, thereby avoiding the precoupling, for instance, in Japanese Laid-Open Patent Applications 57-42042, 57-45094, and 57-125091.

However, the above-mentioned method still has the problem that the preservation of the thermal development diazo copying material is insufficient for use in practice.

Furthermore, Japanese Laid-Open Patent Applications 57-44141 and 59-190886 disclose methods by which any of a diazo compound, a coupling component or an alkaline generating agent is capsuled to avoid mutual contact of these components. These methods, however, do not satisfy the requirements for the preservability and thermal coloring performance for use in practice.

Japanese Laid-Open Patent Application 57-142391 discloses an alternative method for minimizing the contact of a diazo compound and a coupling component, by which a layer for a diazo compound and a layer for a coupling component are overlaid, and an intermediate resin layer comprising a thermofusible material is interposed between the two layers to separate the two layers.

Japanese Laid-Open Patent Publication 4-3315 discloses that a binder agent which is alkali-soluble and becomes insoluble in contact with an acid is used in a base-containing development agent layer.

The former method disclosed in Japanese Laid-Open Patent Application 57-142391, however, has the shortcoming that the separation effect of the intermediate resin layer is not sufficient for use in practice, and the latter method disclosed in Japanese Laid-Open Patent Publication 4-3315 cannot prevent the occurrence of the precoupling phenomenon in the thermal development diazo copying material during the preservation thereof prior to use because the binder also contains a base, and the binder agent does not become insoluble to a sufficient extent for use in practice.

SUMMARY OF THE INVENTION

It is therefore an object of the present invention to provide a thermal development diazo copying material from which the shortcomings of the conventional thermal development diazo copying materials have been eliminated, which is capable of yielding images with improved high image density, and has excellent thermal response and highly reliable preservability for an extended period of time.

This object of the present invention is achieved by a thermal development diazo copying material comprising a support, a diazo layer comprising a diazo compound, and a coupler layer comprising a coupling component, an alkali-soluble resin and a thermofusible material, which are overlaid on the support.

DESCRIPTION OF THE PREFERRED EMBODIMENTS

As mentioned above, a thermal development diazo copying material of the present invention comprises a support, a diazo layer comprising a diazo compound, and a coupler layer comprising a coupling component, an alkali-soluble resin and a thermofusible material, which are overlaid on the support.

As the above-mentioned thermofusible material, a compound of the following formula (I) can be employed:

$$R^1CONHR^2 \quad (I)$$

wherein $R^1$ is an alkyl group having 8 to 22 carbon atoms, or an aryl group, and $R^2$ is hydrogen, an alkyl group having 1 to 18 carbon atoms, or an aryl group.

As the above-mentioned alkali-soluble resin, a styrene-acrylic acid copolymer can be employed.

Furthermore, as the above-mentioned alkali-soluble resin, an isobutylene—maleic anhydride copolymer, and a mixture of an isobutylene—maleic anhydride copolymer and a styrene—maleic anhydride copolymer can be employed.

Furthermore, as the above-mentioned alkali-soluble resin, a styrene—acrylic acid copolymer with the acrylic acid moiety thereof being partially neutralized with a water-soluble guanidine derivative can also be employed.

Furthermore, as the above-mentioned alkali-soluble resin, a styrene—maleic anhydride copolymer can be employed.

The diazo layer may further comprise a guanidine derivative of the following formula (II) and a water-soluble salt of an organic acid:

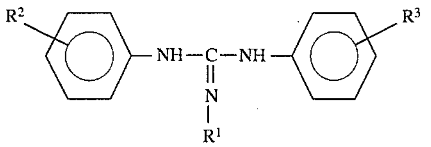

II wherein $R^1$ is hydrogen, or an alkyl group, and $R^2$ and $R^3$ are each hydrogen, an alkyl group, an alkoxyl group, or a halogen.

The inventors of the present invention have discovered that when a diazo layer comprising a diazo compound is formed on a support, and a coupler layer comprising a coupling component is overlaid thereon by coating a mixture of the coupling component, an alkali-soluble resin, in particular, a resin which is soluble in ammonia water, for example, isobrtylene—maleic anhydride copolymer, styrene—maleic anhydride copolymer, styrene—acrylic acid copolymer, and ammonia water, and drying the mixture, the alkali-soluble resin becomes insoluble with the evaporation of ammonia in the course of the drying, and the coupling component is covered with the resin, so that the coupling component is separated from the diazo compound, and the precoupling of the diazo compound and the coupling component during the preservation thereof can be avoided, but when a base serving as coloring promoting agent is present, the alkali-soluble resin does not become insoluble sufficiently for use in practice, so that the prevention of the precoupling is insufficient.

The inventors of the present invention have further discovered that when a thermofusible material is used in place of a base, not only the precoupling can be avoided, but also the coloring at the application of heat can be promoted. The present invention is based on these discoveries.

Examples of the above-mentioned alkali-soluble resin include styrene—acrylic acid copolymer, styrene maleic anhydride copolymer, and isobrtylene—maleic anhydride copolymer. In particular, a mixture of styrene—acrylic acid copolymer and styrene—maleic anhydride copolymer, and a mixture of styrene—acrylic acid copolymer and isobrtylene—maleic anhydride copolymer are preferable for use in the present invention.

When these mixed resins are employed, the precoupling during the preservation, and the fogging of the background of the thermal development diazo copying material can be more effectively prevented, and the coloring performance can also be more improved, in comparison with the case where mono-component resins are employed. The reasons for this have not yet been clarified, but it is considered that when the above-mentioned mixed resins are employed, the following phenomenon takes place and brings about the above-mentioned advantages over the mono-component resins:

An aqueous solution of (a) an ammonium salt of styrene—acrylic acid copolymer, and (b) an ammonium salt of isobrtylene—maleic anhydride copolymer or styrene—maleic anhydride copolymer is transparent when the concentration of these resins is low, while when the concentration of these resins is high, the solution gels and becomes milky white in color. Because of this phenomenon, when the above-mentioned solution in which a coupling component is dispersed is coated on a support and dried, the dispersion gels with the evaporation of water and ammonia and a firm film is formed.

It is preferable that the mixing ratio by parts by weight of styrene—acrylic acid copolymer: isobrtylene—maleic acid anhydride or styrene—maleic anhydride copolymer be (0.95 to 0.05):(0.05 to 0.95).

The above-mentioned alkali-soluble resins are usually used by dissolving them in ammonia water. However, in the present invention, part of the ammonia used as a base for dissolving styrene—acrylic acid copolymer is replaced by a water-soluble guanidine compound.

When such a solution of the resin is coated and dried, ammonia is evaporated from the ammonium salt of acrylic acid, so that acrylic acid is liberated. The liberated acrylic acid becomes insoluble to form a film, but the guanidine remains and forms a salt of acrylic acid. The guanidine salt of acrylic acid does not have any adverse effects on the formation of the insoluble film mentioned above, but serves as a base-generating agent at thermal development.

Examples of a water-soluble guanidine compound for use in the present invention include guanidine and aminoguanidine. It is preferable that the amount of such a water-soluble guanidine compound be in the range of 0.05 to 0.95 equivalents with respect to the acid value of the resin employed.

In the present invention, a guanidine derivative of formula (II) may be contained in the diazo layer in order to improve thermal response of the copying material when copying speed is increased:

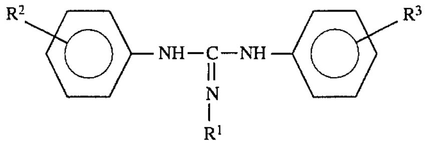

(II)

wherein $R^1$ is hydrogen, or an alkyl group, and $R^2$ and $R^3$ are each hydrogen, an alkyl group, an alkoxyl group, or a halogen.

Furthermore, in order to promote thermal coloring, a water-soluble salt of an organic acid may be contained in the diazo layer.

Examples of an organic acid for the above-mentioned purpose include acetic acid, butyric acid, tartaric acid, citric acid, lactic acid, oxalic acid, maleic acid, and malonic acid.

It is preferable that such an organic acid be employed in an amount of 0.5 to 30.0 parts by weight, more preferably in an amount of 1.0 to 5.0 parts by weight, to one part by weight of a diazo compound.

As the thermofusible material for use in the present invention, compounds with a melting point in the range of 60° to 150° C. which are capable of dissolving therein the coupling component or any of the previously mentioned alkali-soluble resins when fused are preferably employed.

Specific examples of such thermofusible materials for use in the present invention are alcohol derivatives such as 2-tribromoethanol, 2,2-dimethyl trimethylene glycol, and 1,2-cyclohexane diol; waxes such as paraffin wax, microcrystalline wax, montan wax and carnauba wax; higher fatty acid esters such as monostearin and tristearin; and higher alcohols, polyhydric higher alcohols, and higher ketones such polyethylene glycol, polyethylene oxide, and behenyl alcohol.

In particular, an organic acid amide derivative of the following formula (I) is preferably employed as the thermofusible material in the present invention:

$$R^1CONHR^2 \qquad (I)$$

wherein $R^1$ is an alkyl group having 8 to 22 carbon atoms, or an aryl group, and $R^2$ is hydrogen, an alkyl group having 1 to 18 carbon atoms, or an aryl group.

This is because the above organic acid amide derivative is capable of dissolving therein the coupling component or the alkali-soluble resin when fused, so that when this organic acid amide derivative is employed, the coupling reaction and accordingly coloring reaction can be effectively promoted. Furthermore, this organic acid amide derivative is slightly soluble in water, and is not a basic material, so that this organic acid amide derivative does not inhibit the precoupling preventing function of the previously mentioned alkali-soluble resin during the preservation of the copying material.

Specific examples of the organic acid amide of the above-mentioned formula (I) for use in the present invention include: laurylamide, stearamide, behenamide, stearic acid methylolamide, 2-naphthoic acid laurylamide, myristic acid anilide and stearic acid anilide.

As the coupling component for use in the present invention, coupling components in general use for two-component type diazo copying materials can be employed.

Specific examples of such a coupling component for use in the present invention include: resorcinol, phloroglucin, 2,5-dimethyl-4-morpholinomethylphenol, 3-hydroxycyano-acetanilide, p-sulfoacetanilide, 1-benzoyl-amino-8-hydroxynaphthalene-3,6-disulfonamide, 2,2-dihydroxy-naphthalene, 2,7-dihydroxynaphthalene-3,6-sodium disulfonate, 2,3-dihydroxynaphthalene-6-sodium sulfonate, 2,5-dihydroxynaphthalene sodium sulfonate, 1-hydroxy-naphthalene-4-sodium sulfonate, 1-amino-3-hydroxy-naphthalene-3,6-disulfonamide, Naphtol AS-D, 2-hydroxynaphthalene-3-biguanide, 2-hydroxy-3-naphthoic acid morpholinopropylamide, 2-hydroxy-3-naphthoic acid ethanolamide, 2-hydroxy-3-naphthoic acid-N,N-dimethyl-amino-morpholinopropylamide, 2,4,2',4'-tetrahydroxy-diphenyl, and 2,4,2',4'-tetrahydroxydiphenylsulfoxide.

In the present invention, any of the above-mentioned coupling components can be employed. However, from the viewpoint of the preservability, coupling components or couplers which are insoluble or slightly soluble in water are preferable.

Specific examples of such a coupler include Naphtol AS, and Naphtol AS-D. It is understood that these couplers improve the preservability because they can mix with thermofusible materials, in particular, the above-mentioned organic acid amide derivatives, and are highly compatible therewith as is evidenced by the eutectic phenomenon which is observed by the measurement of DSC thereof.

It is preferable that the amount of the coupling component be in the range of 0.1 to 10.00 parts by weight, more preferably in the range of 0.8 to 4.0 parts by weight, to one part by weight of a diazo compound, to obtain sufficient coloring performance and preservability for use in practice, while inhibiting the occurrence of the fogging of the background of the copying material. To be more specific, when the amount of the coupling component is less than 0.1 parts by weight, the coloring tends to become insufficient, while when the amount of the coupling component exceeds 10 parts by weight, the preservability tends to decrease.

Furthermore, it is preferable that the amount of the alkali-soluble resin be in the range of 0.1 to 5.0 parts by weight, more preferably in the range of 0.5 to 3.0 parts by weight, to one part by weight of the coupling component, to obtain sufficient coloring performance and preservability for use in practice, while inhibiting the occurrence of the fogging of the background of the copying material. To be more specific, when the amount of the alkali-soluble resin is less than 0.1 parts by weight, the fogging tends to occur in the background of the copying material, while when the amount of the alkali-soluble resin exceeds 5 parts by weight, the coloring tends to become insufficient for use in practice.

It is preferable that the amount of the thermofusible material be in the range of 0.1 to 10.0 parts by weight, more preferably in the range of 0.5 to 5.0 parts by weight, to one part by weight of the coupling component. When the amount of the thermofusible material is less than 0.1 parts by weight, the coloring tends to become insufficient, while when the amount of the thermofusible material exceeds 10 parts by weight, the touch of the surface of the copying material tends to become rough.

A diazo compound for use in the present invention is a diazonium salt with the following general formula:

$$[ArN_2]^+X^-$$

wherein Ar is a substituted or unsubstituted aromatic moiety, and $X^-$ is an acid anion.

Specific examples of the diazonium compound are double salts of zinc chloride, cadmium chloride, tin chloride and chlorides of the following diazo compounds, and inorganic salts of the following diazo compounds formed with inorganic acids such as sulfuric acid, hexafluorophosphoric acid, and tetrafluoroboric acid:

4-diazo-N,N-dimethylaniline,
4-diazophenyl morpholine,
4-diazo-N,N-dibutylaniline,
4-diazo-2,5-dimethoxyphenyl morpholine,
4-diazo-2,5-diethoxyphenyl morpholine,
4-diazo-2,5-dipropoxyphenyl morpholine,
4-diazo-2,5-dibutoxyphenyl morpholine,
4-diazo-2,5-dibutoxy-N-benzyl-N-ethylaniline,
4-diazo-2,5-dibutoxy-N,N-dibutylaniline,
4-diazo-2,5-dibutoxy-N-benzyl-N-oxyethylaniline,
4-diazo-2,5-dibutoxyphenyl piperazine,
4-diazo-2,5-diethoxyphenyl pyrrolidine,
4-diazo-2,5-dipropoxyphenyl piperidine,
4-diazo-2,5-diethoxy-N,N-dimethylaniline,
4-diazo-1-benzoylamino-2,5-dibutoxybenzene,
4-diazo-1-(4'-methoxybenzoylamino)-2,5-dimethoxybenzene,
4-diazo-1-(4'-methoxybenzoylamino)-2,5-diethoxybenzene,
4-diazo-1-(4'-methylbenzoylamino)-2,5-dipropoxybenzene,
4-diazo-1-(3'-chlorobenzoylamino)-2,5-diethoxybenzene,
4-diazo-1-(3'-methoxybenzoylamino)-2,5-dibutoxybenzene,
4-diazo-1-(3'-methylbenzoylamino)-2,5-dimethoxybenzene,
4-diazo-1-phenylmercapto-2,5-dipropoxybenzene,
4-diazo-1-(4'-toluylmercapto)-2,5-diethoxybenzene,
4-diazo-1-(4'-methoxyphenylmercapto)-2,5-dibutoxybenzene,
4-diazo-1-(4'-chlorophenylmercapto)-2,5-dimethoxybenzene,
4-diazo-1-(3'-toluylmercapto)-2,5-diethoxybenzene,
4-diazo-1-(3'-methoxyphenylmercapto)-2,5-dipropoxybenzene,
4-diazo-1-(2'-toluylmercapto)-2,5-dibutoxybenzene,
4-diazo-1-phenoxy-2,5-dibutoxybenzene, and
4-diazo-1-(4'-methoxyphenoxy)-2,5-diethoxybenzene.

The diazo copying material of the present invention comprises a support, preferably, for example, paper or a plastics film, and a diazo layer comprising a diazo compound, and a coupler layer comprising a coupling component which are overlaid on the support. There is no particular restriction to the overlaying order of the diazo layer and the coupler layer.

When the coating liquids for the formation of the diazo layer and the coupler layer are in the form of an aqueous solution or in the form of a dispersion liquid, a binder agent may be contained in these coating liquids.

Specific examples of a binder agent for use in these coating liquids are water-soluble resins such as polyvinyl alcohol, polyacrylamide, casein, gelatin, starch, starch derivatives, polyvinyl pyrrolidone, carboxymethyl cellulose, methyl cellulose, ethyl cellulose and hydroxyethyl cellulose; and varieties of emulsion resins such as polyvinyl acetate, polyethyl-acrylate, vinyl chloride—acrylate copolymer, and ethlene—vinyl acetate copolymer.

Furthermore, in order to increase image density and photosensitivity, and to improve writable performance, a precoat layer comprising as the main components finely-divided particles and a binder agent may be interposed between the support and a photosensitive and thermosensitive layer which is composed of the diazo layer and the coupler layer.

The finely-divided particles for use in the precoat layer are finely-divided inorganic and organic particles.

Specific examples of the finely-divided inorganic particles are particles of silica, alumina, kaolin, talc, titanium, calcium carbonate, aluminum hydroxide, and magnesium hydroxide.

Specific examples of the finely-divided organic particles are particles of styrene resin, urea-formaldehyde condensation resin, and benzoguanamine resin.

Specific examples of a binder agent for use in the precoat layer are water-soluble resins such as polyvinyl alcohol, polyacrylamide, casein, gelatin, starch, starch derivatives, polyvinyl pyrrolidone, carboxymethyl cellulose, methyl cellulose, ethyl cellulose and hydroxyethyl cellulose; and varieties of emulsion resins such as polyvinyl acetate, polyethylacrylate, vinyl chloride—acrylate copolymer, and ethlene—vinyl acetate copolymer.

The diazo layer and the precoat layer may further contain water-soluble or water-insoluble basic materials and materials which generate an alkaline component upon the application of heat thereto in order to promote the coloring reaction.

Specific examples of such coloring-reaction promoting materials include sodium hydroxide, potassium carbonate, sodium hydrogencarbonate, sodium acetate, ammonium acetate, ammonium chloride, ammonium sulfate, ammonium citrate, stearylamine, urea, thiourea, allylurea, allylthiourea, methylthiourea, ethylene-thiourea, sodium trichloroacetate, guanidine trichloroacetate, morpholium trichloroacetate, guanidine carbonate, guanidine sulfate, aminoguanidine sulfate, 1,2,3-triphenylguanidine, 1,2-ditolylguanidine, 1,2-dicyclohexylguanidine, imidazole, benzimidazole, 2-heptadecylimidazole, 2-benzylimidazole, 4-phenylimidazole, 2-phenyl-4-methylimidazole, 2-undecylimidazoline, 1,2-diphenyl-4,4-dimethyl-2-imidazoline, N,N'-dibenzylpiperadine, 4,4'-dithiomorpholine, and 2-aminobenzothiazole.

In the thermal development diazo copying material according to the present invention, in addition to the above-mentioned coloring components, varieties of additives for use in the conventional diazo thermo-sensitive recording materials, such as a preservability improving agent, an antioxidant, an acid stabilizer, and a dissolving agent, can also be employed.

Specific examples of a preservability improving agent include naphthalene—sodium monosulfonate, naphthalene—sodium disuifonate, naphthalene—sodium trisulfonate, sulfosalicylic acid, cadmium sulfate, magnesium sulfate, cadmium chloride, and zinc chloride.

Specific examples of an antioxidant include thiourea and urea.

Specific examples of a dissolving agent include caffeine and theophylline.

Specific examples of an acid stabilizer include citric acid, tartaric acid, sulfuric acid, oxalic acid, boric acid, phosphoric acid, and pyrophosphoric acid.

In addition, a small amount of saponin can also be added.

When the thermal development diazo copying material according to the present invention is employed as a light-image-fixing type thermosensitive recording material, a filler can also be added in order to prevent the sticking problem of a thermal head and to improve the running performance of a thermal head.

Specific examples of such a filler include finely-divided organic or inorganic solid particles such as finely-divided particles of styrene resin, urea-formaldehyde resin, aluminum hydroxide, magnesium hydroxide, calcium carbonate, titanium, talc, kaolin, silica, and alumina.

For the same purposes as mentioned above, metal soaps can also be employed.

The thermal development diazo copying material according to the present invention can be employed in a field of various thermosensitive recordings. In particular, the thermal development diazo copying material of the present invention can be advantageously used as an output recording sheet for facsimile and computers, which require high speed recording.

In the thermal development diazo copying material of the present invention, images including characters and figures recorded on the surface of the copying material can be fixed by the exposure thereof to light, thereby decomposing unreacted diazo compound, after image formation by the application of heat thereto.

Furthermore, the thermal development diazo copying material of the present invention can be employed as the material for securities, admission tickets, merchandise coupon, certificates, and slips and for recording necessary information therein.

The features of this invention will become apparent in the course of the following description of exemplary embodiments which are given for illustration of the invention and are not intended to be limiting thereof.

EXAMPLE 1

A precoat layer coating dispersion liquid with the following formulation was coated on the surface of high quality paper by use of a wire bar and dried, whereby a precoat layer with a deposition amount of 2.5 $g/m^2$ on a dry basis was formed on the high quality paper:

[Formulation of Precoat Layer Coating Dispersion Liquid]

| | |
|---|---|
| Silica powder | 2.0 g |
| 10% aqueous solution of polyvinyl alcohol | 20.0 g |
| Water | 78.0 g |

A diazo layer coating liquid of the following formulation was coated by use of a glass doctor on the above formed precoat layer and dried, whereby a diazo layer with a deposition of 0.25 $g/m^2$ on a dry basis was formed on the precoat layer:

| [Formulation of Diazo Layer Coating Liquid] | |
|---|---|
| 4-diazo-1-morpholino-2,5-dibutoxy-benzene chloride.½ zinc chloride [diazo component] | 1.5 g |
| Tartaric acid | 0.5 g |
| Isopropanol | 5 g |
| Saponin | 0.1 g |
| Water | 93.4 g |

A coupler layer coating dispersion liquid of the following formulation was coated by use of a wire bar on the above formed diazo layer and dried, whereby a coupler layer with a deposition of 4.0 $g/m^2$ on a dry basis was formed on the diazo layer:

| [Formulation of Coupler Layer Coating Dispersion Liquid] | |
|---|---|
| 20% dispersion liquid of Naphtol AS [coupling component] | 15 g |
| 20% dispersion liquid of monostearin | 40 g |
| Silica powder | 0.5 g |
| 20% aqueous solution of ammonium salt of styrene - acrylic acid copolymer (Trademark "Johncryl 679", made by S. C. Johnson & Sons, Inc.) | 30 g |
| 5% aqueous solution of methyl cellulose | 50 g |

Thus, a thermal development diazo copying material No. 1 of the present invention was prepared.

EXAMPLE 2

The procedure for the preparation of the thermal development diazo copying material No. 1 of the present invention in Example 1 was repeated except that the 20% dispersion liquid of monostearin employed in the coupler layer coating dispersion liquid in Example 1 was replaced by a 20% dispersion liquid of stearamide, whereby a thermal development diazo copying material No. 2 of the present invention was prepared.

EXAMPLE 3

The procedure for the preparation of the thermal development diazo copying material No. 2 of the present invention in Example 2 was repeated except that the 20% aqueous solution of ammonium salt of styrene—acrylic acid copolymer employed in the coupler layer coating dispersion liquid in Example 2 was replaced by a 20% dispersion liquid of a commercially available ammonium salt of isobrtylene—maleic anhydride copolymer (Trademark "ISOBAM 104", made by Kuraray Co., Ltd.), whereby a thermal development diazo copying material No. 3 of the present invention was prepared.

EXAMPLE 4

The procedure for the preparation of the thermal development diazo copying material No. 2 of the present invention in Example 2 was repeated except that the 20% aqueous solution of ammonium salt of styrene—acrylic acid copolymer employed in the coupler layer coating dispersion liquid in Example 2 was replaced by a 20% dispersion liquid of a commercially available ammonium salt of styrene—maleic anhydride copolymer (Trademark "SMA3000", made by Kuraray Co., Ltd.), whereby a thermal development diazo copying material No. 4 of the present invention was prepared.

EXAMPLE 5

The procedure for the preparation of the thermal development diazo copying material No. 2 of the present invention in Example 2 was repeated except that the 20% dispersion liquid of stearamide employed in the coupler layer coating dispersion liquid in Example 2 was replaced by a 20% dispersion liquid of benzoic acid stearamide, whereby a thermal development diazo copying material No. 5 of the present invention was prepared.

EXAMPLE 6

The procedure for the preparation of the thermal development diazo copying material No. 2 of the present invention in Example 2 was repeated except that the 20% dispersion liquid of stearamide employed in the coupler layer coating dispersion liquid in Example 2 was replaced by a 20% dispersion liquid of stearic acid anilide, whereby a thermal development diazo copying material No. 6 of the present invention was prepared.

EXAMPLE 7

A precoat layer coating dispersion liquid with the following formulation was coated on the surface of high quality paper by use of a Wire bar and dried, whereby a precoat layer with a deposition amount of 3.5 $g/m^2$ on a dry basis was formed on the high quality paper:

| [Formulation of Precoat Layer Coating Dispersion Liquid] | |
|---|---|
| Silica powder | 2.0 g |
| 10% aqueous solution of polyvinyl alcohol | 20.0 g |
| Water | 78.0 g |

A diazo layer coating liquid of the following formulation was coated by use of a glass doctor on the above formed precoat layer and dried, whereby a diazo layer with a deposition of 0.25 $g/m^2$ on a dry basis was formed on the precoat layer:

| [Formulation of Diazo Layer Coating Liquid] | |
|---|---|
| 4-diazo-1-morpholino-2,5-dibutoxy-benzene chloride.½ zinc chloride [diazo component] | 1.5 g |
| Tartaric acid | 0.5 g |
| Isopropanol | 5 g |
| Saponin | 0.1 g |
| Water | 93.4 g |

A coupler layer coating dispersion liquid of the following formulation was coated by use of a wire bar on the above formed diazo layer and dried, whereby a coupler layer with a deposition of 4.0 $g/m^2$ on a dry basis was formed on the diazo layer:

| [Formulation of Coupler Layer Coating Dispersion Liquid] | |
|---|---|
| 20% dispersion liquid of Naphtol AS [coupling component] | 15 g |

-continued

| [Formulation of Coupler Layer Coating Dispersion Liquid] | |
|---|---|
| 20% dispersion liquid of stearamide | 40 g |
| Silica powder | 0.5 g |
| 20% aqueous solution of ammonium salt of styrene - acrylic acid copolymer | 15 g |
| 20% aqueous solution of ammonium salt of isobutylene - maleic anhydride copolymer | 15 g |
| 5% aqueous solution of methyl cellulose | 50 g |

Thus, a thermal development diazo copying material No. 7 of the present invention was prepared.

EXAMPLE 8

The procedure for the preparation of the thermal development diazo copying material No. 7 of the present invention in Example 7 was repeated except that the 20% 20% dispersion liquid of the ammonium salt of isobrtylene—maleic anhydride copolymer employed in the coupler layer coating dispersion liquid in Example 7 was replaced by a dispersion liquid of the ammonium salt of styrene—maleic anhydride copolymer, whereby a thermal development diazo copying material No. 8 of the present invention was prepared.

EXAMPLE 9

The procedure for the preparation of the thermal development diazo copying material No. 7 of the present invention in Example 7 was repeated except that the coupler layer coating liquid employed in Example 7 was replaced by a coupler layer coating liquid with the following formulation, whereby a thermal development diazo copying material No. 9 of the present invention was prepared:

| [Formulation of Coupler Layer Coating Liquid] | |
|---|---|
| 20% dispersion liquid of Naphtol AS [coupling component] | 15 g |
| 20% dispersion liquid of stearamide | 40 g |
| Silica powder | 0.5 g |
| 20% aqueous solution of salts of styrene - acrylic acid copolymer (guanidine salt thereof being 0.5 equivalents, and ammonium salt thereof being 0.5 equivalents with respect to the acid value of the acrylic acid moiety) | 30 g |
| 5% aqueous solution of methyl cellulose | 50 g |

EXAMPLE 10

The procedure for the preparation of the thermal development diazo copying material No. 7 of the present invention in Example 7 was repeated except that the coupler layer coating liquid employed in Example 7 was replaced by a coupler layer coating liquid with the following formulation, whereby a thermal development diazo copying material No. 10 of the present invention was prepared:

| [Formulation of Coupler Layer Coating Liquid] | |
|---|---|
| 20% dispersion liquid of Naphtol AS [coupling component] | 15 g |
| 20% dispersion liquid of stearamide | 40 g |
| Silica powder | 0.5 g |
| 20% aqueous solution of salts of styrene - acrylic acid copolymer (guanidine salt thereof being 0.5 equivalents, and ammonium salt thereof being 0.5 equivalents with respect to the acid value of the acrylic acid moiety) | 15 g |
| 20% aqueous solution of ammonium salt of isobutylene - maleic anhydride copolymer | 15 g |
| 5% aqueous solution of methyl cellulose | 50 g |

EXAMPLE 11

The same precoat layer coating dispersion liquid as that employed in Example 7 was coated on the surface of high quality paper by use of a wire bar and dried, whereby a precoat layer with a deposition amount of 3.5 $g/m^2$ on a dry basis was formed on the high quality paper.

A diazo layer coating liquid of the following formulation was coated by use of a glass doctor on the above formed precoat layer and dried, whereby a diazo layer with a deposition of 0.25 $g/m^2$ on a dry basis was formed on the precoat layer:

| [Formulation of Diazo Layer Coating Liquid] | |
|---|---|
| 4-diazo-1-morpholino-2,5-dibutoxybenzene chloride.½ zinc chloride [diazo component] | 1.5 g |
| Tartaric acid | 0.5 g |
| Isopropanol | 5 g |
| Saponin | 0.1 g |
| 1,3-diphenyl guanidine acetate | 2.0 g |
| Water | 93.4 g |

A coupler layer coating dispersion liquid of the following formulation was coated by use of a wire bar on the above formed diazo layer and dried, whereby a coupler layer with a deposition of 4.0 $g/m^2$ on a dry basis was formed on the diazo layer:

| [Formulation of Coupler Layer Coating Dispersion Liquid] | |
|---|---|
| 20% dispersion liquid of Naphtol AS [coupling component] | 15 g |
| 20% dispersion liquid of stearamide | 40 g |
| Silica powder | 0.5 g |
| 20% aqueous solution of salts of styrene - acrylic acid copolymer (guanidine salt thereof being 0.5 equivalents, and ammonium salt thereof being 0.5 equivalents with respect to the acid value of the acrylic acid moiety) | 15 g |
| 20% aqueous solution of ammonium salt of isobutylene - maleic anhydride copolymer | 15 g |
| 5% aqueous solution of methyl cellulose | 50 g |

Thus, a thermal development diazo copying material No. 11 of the present invention was prepared.

COMPARATIVE EXAMPLE 1

The procedure for the preparation of the thermal development diazo copying material No. 1 of the present invention in Example 1 was repeated except that the coupler layer coating liquid employed in Example 1 was replaced by a coupler layer coating liquid with the following formulation, and the coupler layer coating liquid was coated on the diazo layer by use of a wire bar and dried to form a coupler layer with a deposition amount of 3.0 g/$m^2$ on a dry basis on the diazo layer, whereby a comparative thermal development diazo copying material No. 1 was prepared:

| [Formulation of Coupler Layer Coating Liquid] | |
|---|---|
| 20% dispersion liquid of Naphtol AS [coupling component] | 30 g |
| 20% dispersion liquid of stearamide | 40 g |
| Silica powder | 0.5 g |
| 5% aqueous solution of methyl cellulose | 50 g |

COMPARATIVE EXAMPLE 2

The procedure for the preparation of the thermal development diazo copying material No. 1 of the present invention in Example 1 was repeated except that the coupler layer coating liquid employed in Example 1 was replaced by a coupler layer coating liquid with the following formulation, and the coupler layer coating liquid was coated on the diazo layer by use of a wire bar and dried to form a coupler layer with a deposition amount of 2.5 g/$m^2$ on a dry basis on the diazo layer, whereby a comparative thermal development diazo copying material No. 2 was prepared:

| [Formulation of Coupler Layer Coating Liquid] | |
|---|---|
| 20% dispersion liquid of Naphtol AS [coupling component] | 15 g |
| Silica powder | 0.5 g |
| 20% aqueous solution of ammonium salt of styrene - acrylic acid copolymer | 30.0 g |
| 5% aqueous solution of methyl cellulose | 50 g |

COMPARATIVE EXAMPLE 3

The procedure for the preparation of the thermal development diazo copying material No. 1 of the present invention in Example 1 was repeated except that the coupler layer coating liquid employed in Example 1 was replaced by a coupler layer coating liquid with the following formulation, and the coupler layer coating liquid was coated on the diazo layer by use of a wire bar and dried to form a coupler layer with a deposition amount of 4.0 g/$m^2$ on a dry basis on the diazo layer, whereby a comparative thermal development diazo copying material No. 3 was prepared:

| [Formulation of Coupler Layer Coating Liquid] | |
|---|---|
| 20% dispersion liquid of Naphtol AS [coupling component] | 15 g |
| 20% of dispersion liquid of benzimidazole | 40 g |
| Silica powder | 0.5 g |
| 20% aqueous solution of ammonium salt of styrene - acrylic acid copolymer | 30 g |
| 5% aqueous solution of methyl cellulose | 50 g |

The thus prepared thermal development diazo copying materials Nos. 1 to 11 of the present invention and comparative thermal development diazo copying materials Nos. 1 to 3 were subjected to an exposure and thermal development test, with an original for copying being superimposed on each of the copying materials, by use of a commercially available copying machine (Trademark "COPIART-100" made by Fuji Photo Film Co., Ltd.) with an exposure dial being set at scale 4. As a result, blue images were obtained in each of the thermal development diazo copying materials.

The density of the image area in each copying material was measured by a Macbeth densitometer 914. The results are shown in the following Table 1.

Furthermore, in order to investigate the preservability of each thermal development diazo copying material, each copying material was subjected to a forced deterioration test by allowing each copying material to stand in a desiccator under the conditions that the inner temperature was 50° C., and the humidity was 50% RH, for 24 hours.

Each of the thermal development diazo copying materials subjected to this forced deterioration test was exposed to light in its entirety by use of the same copying machine as mentioned above and was subjected to the same thermal development test as mentioned above.

The density of the background portion of each thermal development diazo copying material was measured by the Macbeth densitometer.

Furthermore, the above test was repeated with respect to the thermal development diazo copying materials which were not subjected to the above-mentioned forced deterioration test, and the density of the background portion of each copying material was compared with the density of the background of each of the copying materials subjected to the forced deterioration test. The results of these tests are also shown in the following Table 1:

TABLE 1

| | Test Items | | |
|---|---|---|---|
| | | Preservability (50° C., 50% RH for 24 hrs.) | |
| Samples | Image Density | Density of Background Before Forced Deterioration | Density of Background After Forced Deterioration |
| Ex. 1 | 0.95 | 0.10 | 0.15 |
| Ex. 2 | 1.14 | 0.11 | 0.15 |
| Ex. 3 | 0.95 | 0.11 | 0.18 |
| Ex. 4 | 1.11 | 0.10 | 0.16 |
| Ex. 5 | 1.09 | 0.10 | 0.15 |
| Ex. 6 | 1.12 | 0.11 | 0.16 |
| Ex. 7 | 1.11 | 0.10 | 0.12 |
| Ex. 8 | 1.13 | 0.10 | 0.13 |
| Ex. 9 | 1.20 | 0.10 | 0.17 |
| Ex. 10 | 1.19 | 0.10 | 0.14 |
| Ex. 11 | 1.24 | 0.10 | 0.15 |
| Comp. Ex. 1 | 0.26 | 0.11 | 0.41 |

TABLE 1-continued

| Samples | Image Density | Test Items: Preservability (50° C., 50% RH for 24 hrs.) Density of Background Before Forced Deterioration | Density of Background After Forced Deterioration |
|---|---|---|---|
| Comp. Ex. 2 | 0.24 | 0.10 | 0.14 |
| Comp. Ex. 3 | 1.11 | 0.12 | 0.54 |

Japanese Patent Applications No. 5-070905 filed Mar. 5, 1993 and Japanese Patent Application No. 5-269863 filed Sep. 30, 1993 are hereby incorporated by reference.

What is claimed is:

1. A thermal development diazo copying material comprising a support, a diazo layer comprising a diazo compound on said support, and a coupler layer comprising a coupling component, an alkali-soluble styrene—acrylic acid copolymer and a thermofusible material overlaid on said diazo layer.

2. The thermal development diazo copying material as claimed in claim 1, wherein said thermofusible material is a compound of the following formula (I):

$$R^1CONHR^2 \quad (I)$$

wherein $R^1$ is an alkyl group having 8 to 22 carbon atoms, or an aryl group, and $R^2$ is hydrogen, an alkyl group having 1 to 18 carbon atoms, or an aryl group.

3. The thermal development diazo copying material as claimed in claim 1, wherein said diazo layer further comprises a guanidine derivative of formula ( II ) and a water-soluble salt of an organic acid:

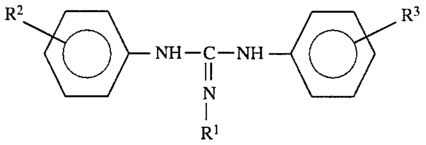

II wherein $R^1$ is hydrogen, or an alkyl group, and $R^2$ and $R^3$ are each hydrogen, an alkyl group, an alkoxyl group, or a halogen.

4. The thermal development diazo copying material as claimed in claim 1, wherein the acrylic acid moiety of said styrene—acrylic acid copolymer is partially neutralized with a water-soluble guanidine derivative.

5. The thermal development diazo copying material as claimed in claim 1, wherein said coupler layer further comprises an isobrtylene—maleic anhydride copolymer.

6. The thermal development diazo copying material as claimed in claim 1, wherein said coupler layer further comprises a styrene—maleic anhydride copolymer.

* * * * *

UNITED STATES PATENT AND TRADEMARK OFFICE

CERTIFICATE OF CORRECTION

PATENT NO. : 5,556,733

DATED : SEPTEMBER 17, 1996

INVENTOR(S) : SHIGERU KUSAKATA, ET AL.

It is certified that error appears in the above-identified patent and that said Letters Patent is hereby corrected as shown below:

Column 3, lines 16, 36, 39, 55 and 65, "isobrtylene"

should read --isobutylene--.

Column 8, line 3, "disuifonate"

should read --disulfonate--.

Column 9, line 53, "isobrtylene"

should read --isobutylene--.

Column 11, line 22, "that the 20% 20%"

should read --that the 20%--.

Column 11, line 23, "isobrtylene"

should read --isobutylene--.

UNITED STATES PATENT AND TRADEMARK OFFICE

CERTIFICATE OF CORRECTION

PATENT NO. : 5,556,733

DATED : SEPTEMBER 17, 1996

INVENTOR(S) : SHIGERU KUSAKATA, ET AL.

It is certified that error appears in the above-identified patent and that said Letters Patent is hereby corrected as shown below:

Column 11, lines 26-27, "by a dispersion"

should read --by a 20% dispersion--.

Column 16, line 24, "isobrtylene"

should read --isobutylene--.

Signed and Sealed this

Seventeenth Day of March, 1998

Attest:

BRUCE LEHMAN

Attesting Officer

*Commissioner of Patents and Trademarks*